(12) United States Patent  (10) Patent No.: US 8,737,141 B2
Melik-Martirosian  (45) Date of Patent: May 27, 2014

(54) APPARATUS AND METHOD FOR DETERMINING AN OPERATING CONDITION OF A MEMORY CELL BASED ON CYCLE INFORMATION

(75) Inventor: Ashot Melik-Martirosian, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/177,518

(22) Filed: Jul. 6, 2011

(65) Prior Publication Data

US 2012/0239858 A1    Sep. 20, 2012

Related U.S. Application Data

(60) Provisional application No. 61/362,272, filed on Jul. 7, 2010.

(51) Int. Cl.
  *G11C 7/00*    (2006.01)

(52) U.S. Cl.
  USPC .................................................. 365/189.011

(58) Field of Classification Search
  USPC .................................................. 365/189.011
  See application file for complete search history.

(56) References Cited

U.S. PATENT DOCUMENTS

| | | | |
|---|---|---|---|
| 5,729,489 A | 3/1998 | Fazio et al. | |
| 6,396,742 B1 | 5/2002 | Korsh et al. | |
| 6,429,785 B1 | 8/2002 | Griffin et al. | |
| 6,519,184 B2 | 2/2003 | Tanaka et al. | |
| 6,643,177 B1 | 11/2003 | Le et al. | |
| 6,675,071 B1 | 1/2004 | Griffin, Jr. et al. | |
| 6,888,758 B1 | 5/2005 | Hemink et al. | |
| 6,928,001 B2 | 8/2005 | Avni et al. | |
| 6,937,521 B2 | 8/2005 | Avni et al. | |
| 7,009,889 B2 | 3/2006 | Tran et al. | |
| 7,054,199 B2 | 5/2006 | Lee et al. | |
| 7,173,852 B2 | 2/2007 | Gorobets et al. | |
| 7,599,208 B2 | 10/2009 | Kang | |
| 7,613,045 B2 | 11/2009 | Murin et al. | |
| 7,656,707 B2 | 2/2010 | Kozlov | |
| 7,812,389 B2 | 10/2010 | Tanaka et al. | |
| 8,072,805 B2 | 12/2011 | Chou et al. | |

(Continued)

OTHER PUBLICATIONS

Zhou, et al., "Error-correcting schemes with dynamic thresholds in nonvolatile memories," Information Theory Proceedings (ISIT), 2011 IEEE International Symposium, Jul. 31-Aug. 5, 2011, pp. 2143-2147.

(Continued)

*Primary Examiner* — Huan Hoang
*Assistant Examiner* — Min Huang
(74) *Attorney, Agent, or Firm* — McDermott Will & Emery LLP

(57) ABSTRACT

Disclosed is an apparatus and method for determining a parameter for programming a non-volatile memory circuit. On receiving write or erase operation a parameter is determined as a function of a circuit characteristic associated with a memory block. An adjusted condition, for example, read or write time, or the standard deviation of voltage thresholds in a distribution of cells, is then determined as a function of the parameter, and a command provided to the memory circuit to use the parameter in the next write or erase operation performed on the memory block. The method can be triggered by an event such as P/E cycle times and the condition is dynamically adjusted to extend the life of the memory circuit.

25 Claims, 12 Drawing Sheets

(56) References Cited

U.S. PATENT DOCUMENTS

| | | |
|---|---|---|
| 8,086,225 B2 | 12/2011 | Lee |
| 8,315,092 B2 | 11/2012 | Strasser et al. |
| 2002/0174394 A1 | 11/2002 | Ledford et al. |
| 2005/0125199 A1 | 6/2005 | Slaight |
| 2005/0144358 A1 | 6/2005 | Conley et al. |
| 2005/0248999 A1 | 11/2005 | Tamura et al. |
| 2006/0039196 A1 | 2/2006 | Gorobets et al. |
| 2006/0061795 A1 | 3/2006 | Walmsley |
| 2006/0244041 A1 | 11/2006 | Tanaka et al. |
| 2008/0229164 A1 | 9/2008 | Tamura et al. |
| 2009/0104900 A1 | 4/2009 | Lee |
| 2009/0109756 A1* | 4/2009 | Aritome ............ 365/185.12 |
| 2009/0187785 A1 | 7/2009 | Gonzalez et al. |
| 2009/0259916 A1 | 10/2009 | Hsu et al. |
| 2009/0282189 A1 | 11/2009 | Best et al. |
| 2010/0008137 A1* | 1/2010 | Jang et al. ............ 365/185.2 |
| 2010/0110748 A1 | 5/2010 | Best |
| 2010/0118608 A1 | 5/2010 | Song et al. |
| 2010/0180073 A1 | 7/2010 | Weingarten et al. |
| 2010/0315873 A1 | 12/2010 | Lee |
| 2011/0055468 A1 | 3/2011 | Gonzalez et al. |
| 2011/0167305 A1 | 7/2011 | Haratsch et al. |
| 2011/0188291 A1 | 8/2011 | Chevallier et al. |
| 2011/0219203 A1 | 9/2011 | Nurminen et al. |
| 2012/0017138 A1 | 1/2012 | Erez et al. |
| 2012/0147660 A1 | 6/2012 | Chevallier et al. |
| 2012/0236641 A1* | 9/2012 | Hu ...................... 365/185.03 |
| 2012/0239991 A1* | 9/2012 | Melik-Martirosian ....... 714/708 |
| 2012/0319585 A1 | 12/2012 | Shteynberg et al. |
| 2013/0007344 A1 | 1/2013 | Belgal et al. |
| 2013/0097362 A1 | 4/2013 | Tan et al. |

OTHER PUBLICATIONS

Cai, et al., "Flash Correct-and-Refresh: Retention-Aware Error Management for Increased Flash Memory Lifetime," Computer Design (ICCD), 2012 IEEE 30$^{th}$ International Conference, Septembr 20-Oct. 3, 2012, pp. 94-101.

Chen, et al., "Reliability analysis and improvement for multi-level non-volatile memories with soft information," Design Automation Conference (DAC), 2011, 48$^{th}$ ACM/EDAC/IEEE, Jun. 2011, pp. 753-758.

* cited by examiner

APPARATUS AND METHOD FOR DETERMINING AN OPERATING CONDITION OF A MEMORY CELL BASED ON CYCLE INFORMATION

CROSS-REFERENCES TO RELATED APPLICATIONS

This application claims priority from U.S. Provisional Application No. 61/362,272, filed Jul. 7, 2010, which is incorporated herein by reference in its entirety.

TECHNICAL FIELD

The subject technology relates generally to memory devices and in particular a system and process that extends the life span of a multi-level cell flash memory.

BACKGROUND

Flash memory bears little resemblance to a magnetic recording system. Commodity flash chips are closed systems with no external access to analog signals, in sharp contrast to the typical Hard Disk Drive (HDD) where analog signals have always been available for study. Even though the HDD is a complex electro-mechanical system and can suffer catastrophic failure, it has been possible to engineer drives to have a life expectancy with little to no degradation in performance, which last beyond their time of technical obsolescence. Flash memory, on the other hand, has a finite life expectancy with gradual degradation in performance through the life cycle. Consequently, since flash memory was first conceived as a memory device the target error rate at the output of the chip has been very low, as opposed to systems where stronger Error Correction Coding (ECC) may be used.

Lower priced Solid State Drives (SSD) are typically manufactured using multi-level cell (MLC) flash memory for increased data capacity, but MLC is less reliable than single-level cell (SLC) flash memory. Consumer SSD manufacturers have mitigated such problems by employing interleaving and/or providing excess capacity in conjunction with wear-leveling algorithms. MLC flash endurance, however, has not been proven acceptable for enterprise SSD applications. Even with the increased data capacity of MLC, it becomes more expensive in enterprise applications because of its disproportionately large decrease in program/erase (P/E) endurance, due to increased (wear causing) stresses required to read, program, and erase the flash.

SUMMARY

Disclosed is a method for adjusting an operating condition in a memory block of a non-volatile memory circuit. In one aspect the method includes storing a parameter, the operating condition being a function of the parameter, monitoring a memory operation for a trigger event, and, on the trigger event, adjusting the parameter in accordance with a circuit characteristic associated with the memory block, and providing to the memory circuit a command representative of an instruction to apply a series of voltage pulses to a group of cells in the memory block in accordance with the parameter to adjust the operating condition.

Also disclosed is a control circuit for adjusting an operating condition in a memory block of a non-volatile memory circuit. In one aspect, the control circuit includes a memory interface configured to be operably coupled to the memory circuit, and a controller. The controller may be configured to store a parameter, the operating condition being a function of the parameter, monitor a memory operation for a trigger event, and, on the trigger event, adjust the parameter in accordance with a circuit characteristic associated with the memory block, and provide to the memory interface a command representative of an instruction to apply a series of voltage pulses to a group of cells in the memory block in accordance with the parameter to adjust the operating condition.

Also disclosed is a system for adjusting an operating condition in a memory block of a non-volatile memory circuit. In one aspect, the system includes a host interface configured to be operably coupled to a host device, to receive data from the host device, and to send data to the host device, a memory interface operably coupled to the memory circuit, a storage medium interface operably coupled to a volatile memory, and a controller operably coupled to the host interface. The controller may be operable to store a parameter in the volatile memory, the operating condition being a function of the parameter, monitor a memory operation for a trigger event, and, on the trigger event, adjust the parameter in accordance with a circuit characteristic associated with the memory block, and provide to the memory circuit a command representative of an instruction to apply a series of voltage pulses to a group of cells in the memory block in accordance with the parameter to adjust the operating condition.

Also disclosed is a method for populating a parameter set for dynamically adjusting an operating condition in a memory block of a non-volatile memory circuit. In some aspects the method for populating a parameter set includes the steps of identifying a desired condition limit, computing a first parameter as a function of a first memory operation to be performed on the memory block, the operating condition being a function of the parameter, including the first parameter in the parameter set, cycling the memory block until the operating condition reaches the desired condition limit, determining after the cycling a second parameter as a function of a second memory operation to be performed on the memory block, including the second parameter in the parameter set. The steps of he cycling and the determining and the including the second parameter may be repeated until a desired number of cycles is reached. The method may further include performing a retention bake on the memory circuit, performing a read operation on the memory block, and verifying a bit error rate resulting from the read operation does not exceed a desired error rate.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
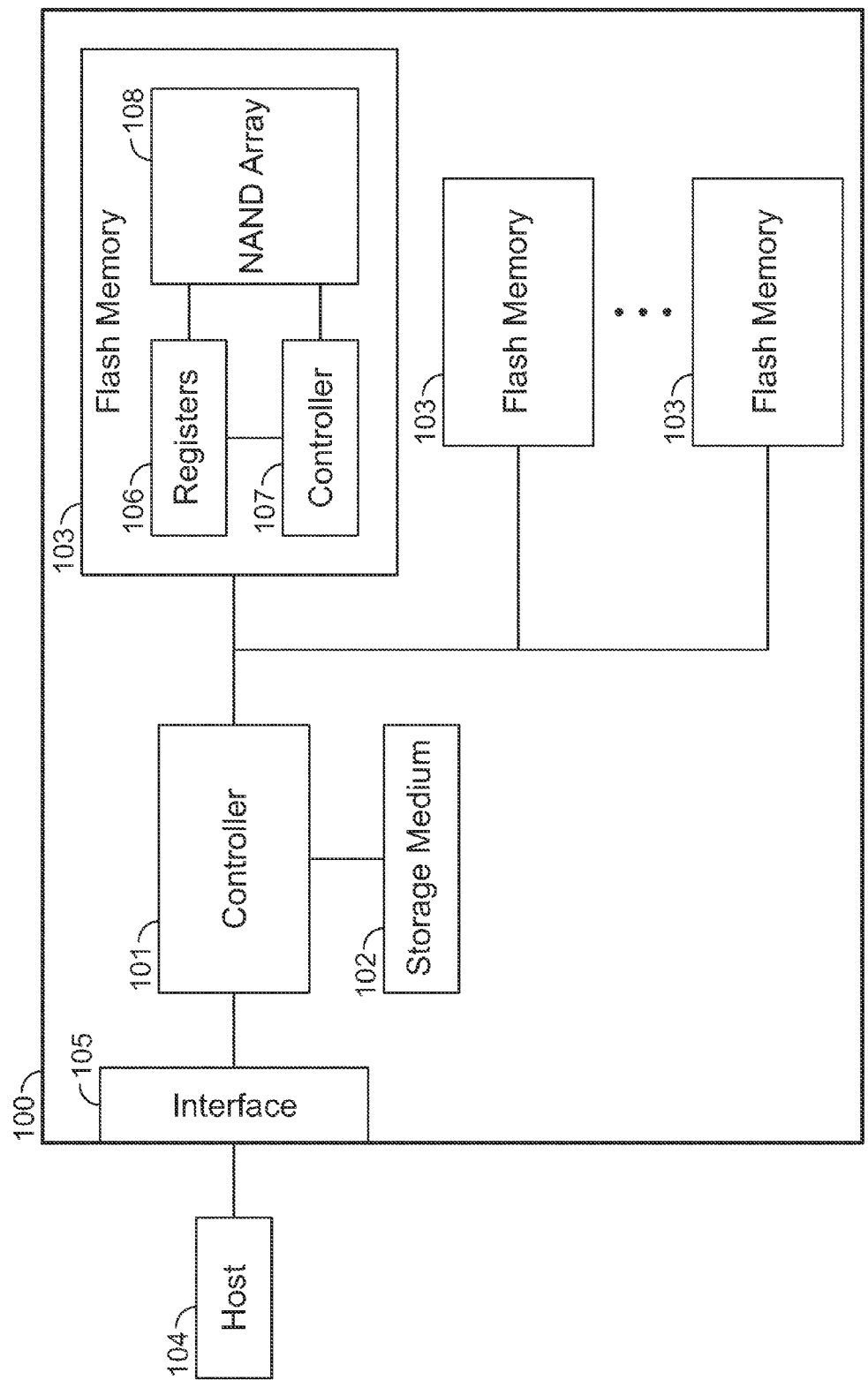
FIG. 1 is a block diagram illustrating components of a data storage system according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In a flash memory device, for example, with NAND architecture, memory cells are grouped in strings, with each string consisting of a set of transistors connected in series between a drain select transistor, connected to a bit line of the memory block, and a source select transistor, connected to a reference voltage distribution line. Each memory cell consists of a floating-gate MOS transistor. When programming a memory cell, electrons are injected into the floating-gate, for example, by means of Fowler-Nordheim (F-N) Tunneling. The non-volatility of the cell is due to the electrons maintained within the floating-gate. Bits are stored by trapping charge on the floating gate (an electrically isolated conductor) which stores a logic value defined by the threshold voltage of the cell (read threshold) commensurate with the electric charge stored. When the cell is erased, the electrons in the floating gate are removed by quantum mechanical tunneling (a tunnel current) from the floating gate to, for example, the source and/or substrate.

As flash memory is cycled (that is, programmed and erased repeatedly), its physical qualities change. For example, the repeated placement and removal of electrons to and from the floating gate during programming and erase operations, respectively, causes some excess electrons to be trapped in the device. Also, when one or multiple cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (voltage) and duration; that is, programming the flash memory to high threshold voltage conditions increases the rate of damage arising from both program and erase processes because it requires longer duration and/or higher applied fields. For instance, adding enough electrons can change a cell from an erased state to a programmed state.

As a flash memory device ages, error rates increase due to increasingly changing threshold voltage conditions. Endurance has been sacrificed to meet the requirements of mainstream consumer flash applications, which require flash to have low cost, long retention time, fast programming/erase, and low error rate to work with unsophisticated controllers. Contrary to industry practice, the subject technology provides a system and process for use in memory cell architectures that dynamically adjusts program and erase conditions to reduce bit error rate (BER) and variation in device performance, and to achieve a higher number of cycles the device can undergo, thereby improving the reliability and endurance of flash memory, making it suitable for enterprise applications.

FIG. 1 is a block diagram illustrating components of a data storage system according to one aspect of the subject technology. As depicted in FIG. 1, in some aspects, data storage system 100 (for example, a solid state drive) includes data storage controller 101, storage medium 102, and flash memory 103. Controller 101 may use storage medium 102 for temporary storage of data and information used to manage data storage system 100. Controller 101 may include several internal components (not shown) such as a read-only memory, a flash component interface (for example, a multiplexer to manage instruction and data transport along a serial connection to flash memory 103), an I/O interface, error correction circuitry, and the like. In some aspects, all of these elements of controller 101 may be integrated into a single chip. In other aspects, these elements may be separated on their own PC board.

Controller 101 may also include a processor that may be configured to execute code or instructions to perform the operations and functionality described herein, manage request flow and address mappings, and to perform calculations and generate commands. The processor of controller 101 is configured to monitor and/or control the operation of the components in controller 101. The processor may be a general-purpose microprocessor, a microcontroller, a digital signal processor (DSP), an application specific integrated circuit (ASIC), a field programmable gate array (FPGA), a programmable logic device (PLD), a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, and flash memory 103 represent examples of machine or computer readable media on which instructions/code executable by controller 101 and/or its processor may be stored. Machine and/or computer readable media may generally refer to any medium or media used to provide instructions to controller 101 and/or its processor, including volatile media, such as dynamic memory used for storage media 102 or for buffers within controller 101, and non-volatile media, such as electronic media, optical media, and magnetic media.

In some aspects, controller 101 is configured to store data received from a host device 104 in flash memory 103 in response to a write command from host device 104. Controller 101 is further configured to read data stored in flash memory 103 and to transfer the read data to host device 104 in response to a read command from host device 104. As will be described in more detail below, controller 101 may be configured to, as the number of P/E cycles increases, determine and/or adjust program and/or erase conditions as a function of one or more circuit characteristics associated with flash memory 103. By dynamically adjusting program and/or erase conditions of flash memory 103, the subject technology may increase the number of P/E operations that may be performed on memory cells within flash memory 103 in a particular application environment, and increase the endurance of the cells compared to the same application environment operating without the ability to dynamically adjust these conditions.

Host device 104 represents any device configured to be coupled to data storage system 100 and to store data in data storage system 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage data storage system 100. According to one aspect of the subject technology, storage medium 102 is random access memory (RAM) such as double data rate (DDR) RAM. Other types of RAM also may be used to implement storage medium 102. Memory 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, data storage system 100 may also include host interface 105. Host interface 105 is configured to be operably coupled to host device 104 (for example, by wired or wireless connection), to receive data from host device 104 and to send data to host device 104. Host interface 105 may include electrical and/or physical connections, and or wireless connection, for operably coupling host device 104 to controller 101 (for example, via the I/O interface of controller 101). Host interface 105 is configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which may be individually selectable using a configuration parameter selected by a user or programmed at the time of assembly. Host interface 105 may include one or more buffers for buffering transmissions between host device 104 and controller 101.

Flash memory 103 represents a non-volatile memory device for storing data. According to one aspect of the subject technology, flash memory 103 includes, for example, a NAND flash memory. Flash memory 103 may include a single flash memory device or chip, or, as depicted by FIG. 1, may include multiple flash memory devices or chips arranged in multiple channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash memory and returns only internally detected bit values for data. In one aspect, the interface of flash memory 103 is used to access one or more internal registers 106 and an internal flash controller 107 for communication by external devices. In some aspects, registers 106 may include address, command, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register is included to control parity, interrupt control, and the like. In some aspects, internal flash controller 107 is accessible via a control register to control the general behavior of flash memory 103. Internal flash controller 107 and/or the control register may control the number of stop bits, word length, receiver clock source, and may also control switching the addressing mode, paging control, coprocessor control, and the like.

In some aspects, registers 106 may also include a test register. The test register may be accessed by specific addresses and/or data combinations provided at the interface of flash memory 103 (for example, by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming parameters of flash memory 103 (for example, voltage levels applied to memory cells) to dynamically vary how data is programmed to and/or erased from the memory cells of memory arrays 108.

Figure 2:
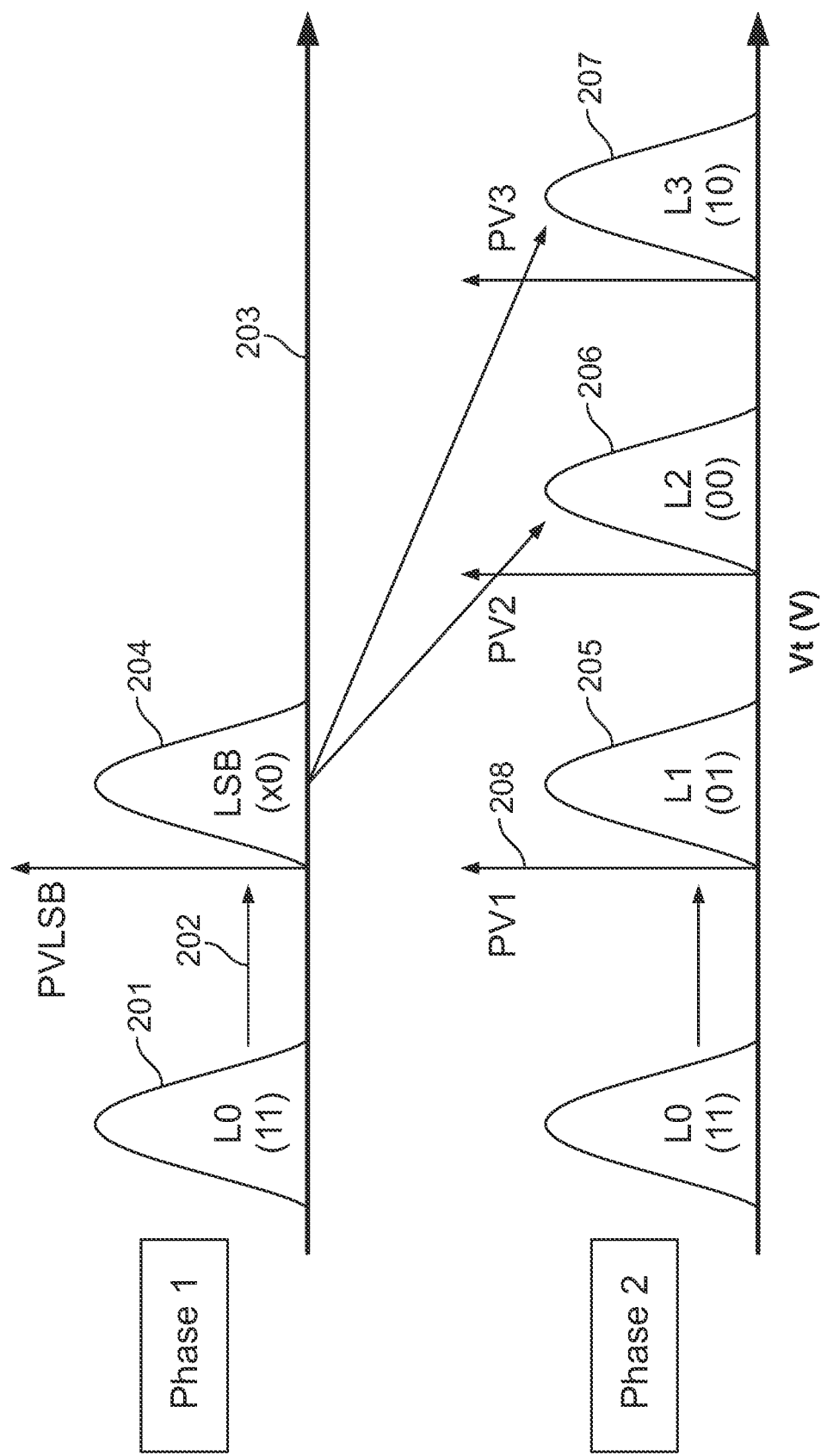
FIG. 2 is a diagram illustrating an exemplary graph diagram of four possible cell $V_T$ distributions and complimentary program verify levels for a group of memory cells in a multi-level cell flash memory according to one aspect of the subject technology.

The storage capacity of SSDs can be increased using MLC NAND flash memory. MLC provides for more than one bit per cell by choosing between multiple amounts of electrical charge to store in the floating gates of its cells to achieve multiple states of conductivity, each occurring at a different voltage threshold $V_T$. FIG. 2 is a diagram illustrating an exemplary graph diagram of four possible cell $V_T$ distributions and corresponding program verify levels for a group of memory cells in a multi-level cell flash memory according to one aspect of the subject technology. As depicted, an MLC NAND cell is capable of storing four states (amounts of charge) per cell, yielding two logical bits of information per cell: the Most Significant Bit (MSB) and the Least Significant Bit (LSB). These two bits may make up corresponding MSB and LSB pages of a memory block.

In some aspects, a NAND memory block is programmed one page at a time using an Incremental Step Pulse Program (ISSP) and erased using a similar Incremental Step Pulse Erase Erase (ISPE). In some aspects, ISPP and/or ISPE may be performed by flash controller 107 in response to one or more commands received from controller 101. For example, the memory cells that are to be programmed by ISPP may be selected at the bit line. A "page operation" may be performed by applying a voltage at the gates of each cell in the memory page. A corresponding selection at the bit lines creates a voltage potential in the selected group of memory cells where the LSB is selected to be different (for example, binary 10 or 00) than the erased L0 distribution state 201 (for example, binary 11). Accordingly, ISPP increases 202 the threshold voltage $V_T$ 203 of the selected group of cells to create LSB distribution 204. Then, in a similar manner, during a MSB page program operation, ISPP is applied to create an L1 distribution 205 from the erased L0 distribution 201 (for example, binary 01), or, an L2 distribution 206 (for example, binary 00) or L3 distribution 207 (for example, binary 10) from the previously programmed LSB distribution 204. In some aspects, all of the above distributions are created from L0 distribution 201 by applying a series of ISPP voltage pulses to the memory cells of the page which is being programmed. In some aspects, the ISPP includes a series of voltage pulses that are applied in a step pattern with the amplitude of each pulse incrementally increased with increasing pulse number, starting from a certain starting magnitude. In some aspects, flash controller 107 of flash memory 103 may perform a programming verification (sensing) operation in between each step. To verify that a cell has been successfully programmed, controller 107 applies a program verify voltage 208 in an attempt to measure the voltage of the cell. In some aspects, if the threshold voltage of a cell in the memory page is detected above a certain program verify level, flash controller 107 may stop further programming of that single cell by setting it to a program inhibit state.

In some aspects, LSB and MSB programming may use different values of ISPP starting magnitude and/or ISPP step magnitude. Accordingly, different ISPP step and/or starting magnitudes may be used during the MSB programming of L1 distribution 205 than in the programming of L2 distribution 206 and/or L3 distribution 207. This is because programming to a higher $V_T$ level may require the application of a higher programming voltage potential. It has been found that higher programming pulse magnitudes generally result in faster programming, and smaller ISPP step magnitudes and/or narrower pulse widths generally result in narrower final $V_T$ distributions (for example, a distribution of cells programmed to the same $V_T$ distribution having a smaller standard deviation). In some aspects, these parameter values may be stored in one or more lookup tables in storage medium 102 and accessed by controller 101 to use in conjunction with generating commands. Controller 101 may be configured to communicate with and provide the commands to flash memory 103 via registers 106 (for example, the test register) and/or flash controller 107 to modify the ISPP and/or ISPE parameters of flash memory 103 (for example, nominal parameters set by the chip manufacturer) to vary the $V_T$ distributions at run-time. As will be further described, these parameters can be dynamically determined and/or adjusted at run-time as a function of various circuit characteristics (for example, P/E cycles, programming and/or erase time, retention time, BER, temperature, memory block address, memory page address, and the like) and/or in response to commands received from host 104 via host interface 105.

Figure 3:
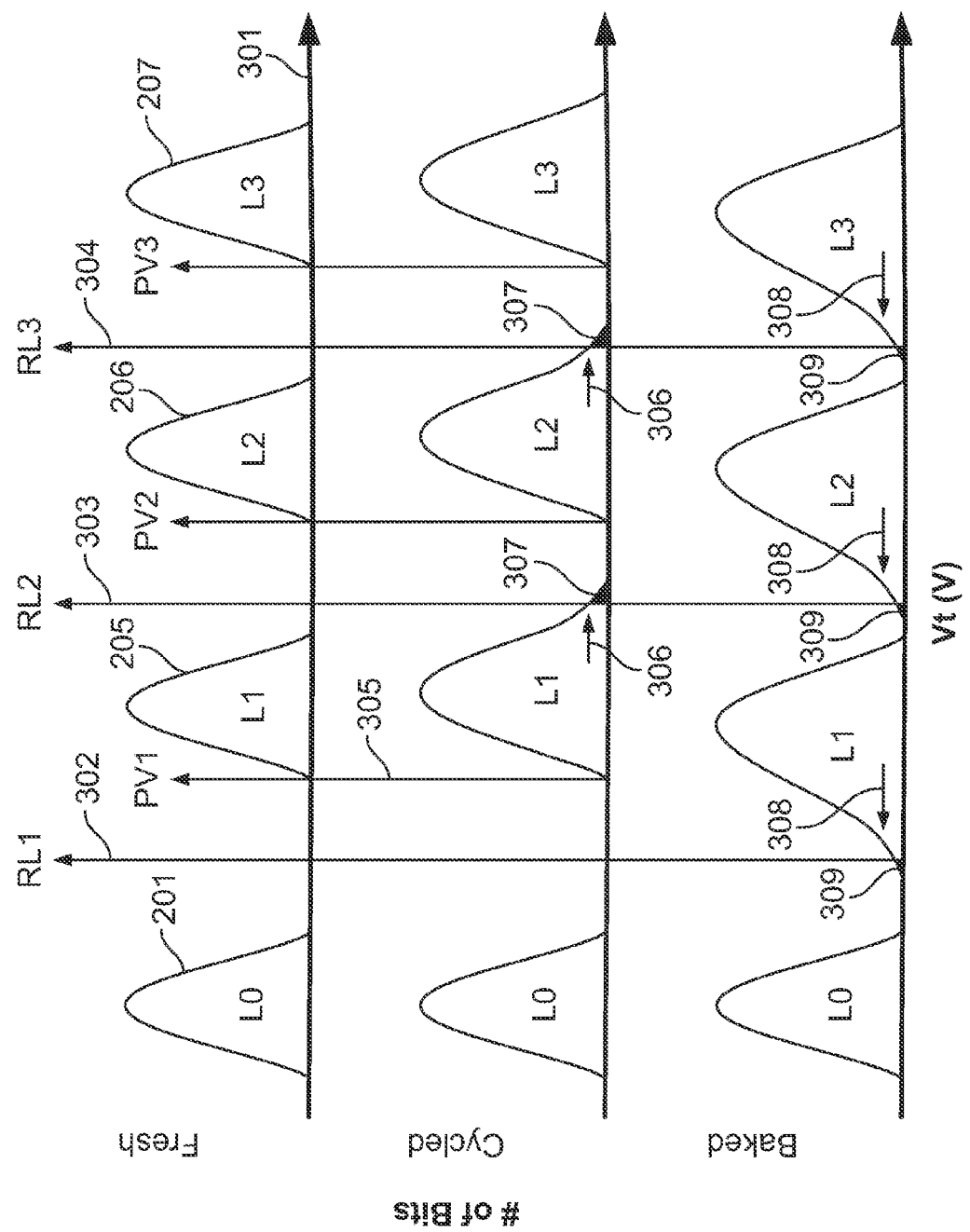
FIG. 3 is a graph diagram illustrating an exemplary threshold voltage evolution of a 2-bit MLC NAND flash memory cell with programming and erase conditions chosen apriori at beginning of life according to one aspect of the subject technology.

FIG. 3 is a graph diagram illustrating an exemplary threshold voltage evolution of a 2-bit MLC NAND flash memory cell with programming and erase conditions chosen apriori at beginning of life according to one aspect of the subject technology. The topmost row represents the four possible distributions of each programming state in a group of memory cells at beginning of life (BOL). The respective programming distributions of L0 distribution 201, L1 distribution 205, L2 distribution 206, and L3 distribution 207 are shown along a voltage threshold continuum 301. The middle row of FIG. 3 depicts an exemplary progression of the programming distributions after repeated P/E cycling. The buildup of electrons trapped in the memory cells has caused some cells be programmed to higher voltage thresholds (increasing the standard deviation of the distribution at a higher $V_T$). This shift 306 in voltage thresholds may eventually cause the right edges of the $V_T$ distributions to reach the higher adjacent read levels. When the $V_T$ of some of the cells in the distributions begins to cross 307 the higher read levels, the likelihood that a read operation will produce an error increases. The bottom row depicts an exemplary result of an extended retention time on the memory cells. After a number of P/E cycles and an extended retention time memory cells have lost electrons, causing the voltage thresholds of the cells to decrease. This shift 308 may eventually cause the left edges of the $V_T$ distributions to reach the lower adjacent read levels. The bigger the number of P/E operations performed on the memory cells and the longer the retention time, the more extreme the decrease in the voltage thresholds of the memory cells. If the read levels remain fixed, the $V_T$ distributions that have crossed 309 the next lower read level may cause significant errors.

With reference to the top row of FIG. 3, after ISPP, the edges of each of the distributions are suitably spaced from adjacent read levels. In some aspects, spacing can be altered by setting program verify voltages 305 (for example, PV1, PV2, and/or PV3) during the verification operation sufficiently higher than a lower read level, but sufficiently low enough to prevent even those cells in the distribution having the highest $V_T$ (largest deviation) from crossing the adjacent higher read level. To ensure that all cells in a distribution will conduct, a read level voltage greater than the distribution is applied. In this regard, RL1 voltage 302 will cause cells in L0 distribution 201 to conduct, RL2 voltage 303 will cause cells in L1 distribution 205 to conduct, RL3 voltage 304 will cause cells in L2 distribution to conduct, and so on. Where, as depicted by FIG. 3, only four states are available, RL3 voltage 304 will not cause any cells in L3 distribution 207 to conduct, thereby generating a binary x0 in the LSB (see FIG. 2) for those cells. Generally, for N distributions there will be N–1 read levels. In the depicted example, there are four distributions (of $V_T$ states) and three read levels. Those skilled in the art will recognize that there may be eight, sixteen, or more distributions without departing from the scope of the subject technology.

In one aspect, read levels are programmed to remain static to accommodate both higher and lower $V_T$ distribution shifts. Controller 101 is configured to, as BER increases, determine and dynamically adjust the ISPP and/or ISPE parameters to correct the standard deviations of the distributions to reduce the risk of the $V_T$ distributions crossing their adjacent read levels, and to prolong the endurance of the memory cells. As flash memory 103 is cycled, controller 101 may progressively reduce the values of the input parameters to ISPP (for example, starting magnitude voltages, steps, and pulse widths) for both LSB and MSB programming. The parameters may also be adjusted while keeping the programming time within a certain predetermined range. In some aspects, the parameters may represent a voltage level or a function thereof, however, one skilled in the art will recognize that the parameters may represent, for example, an electric current, electrical resistance, slope thereof, and the like.

Figure 4:
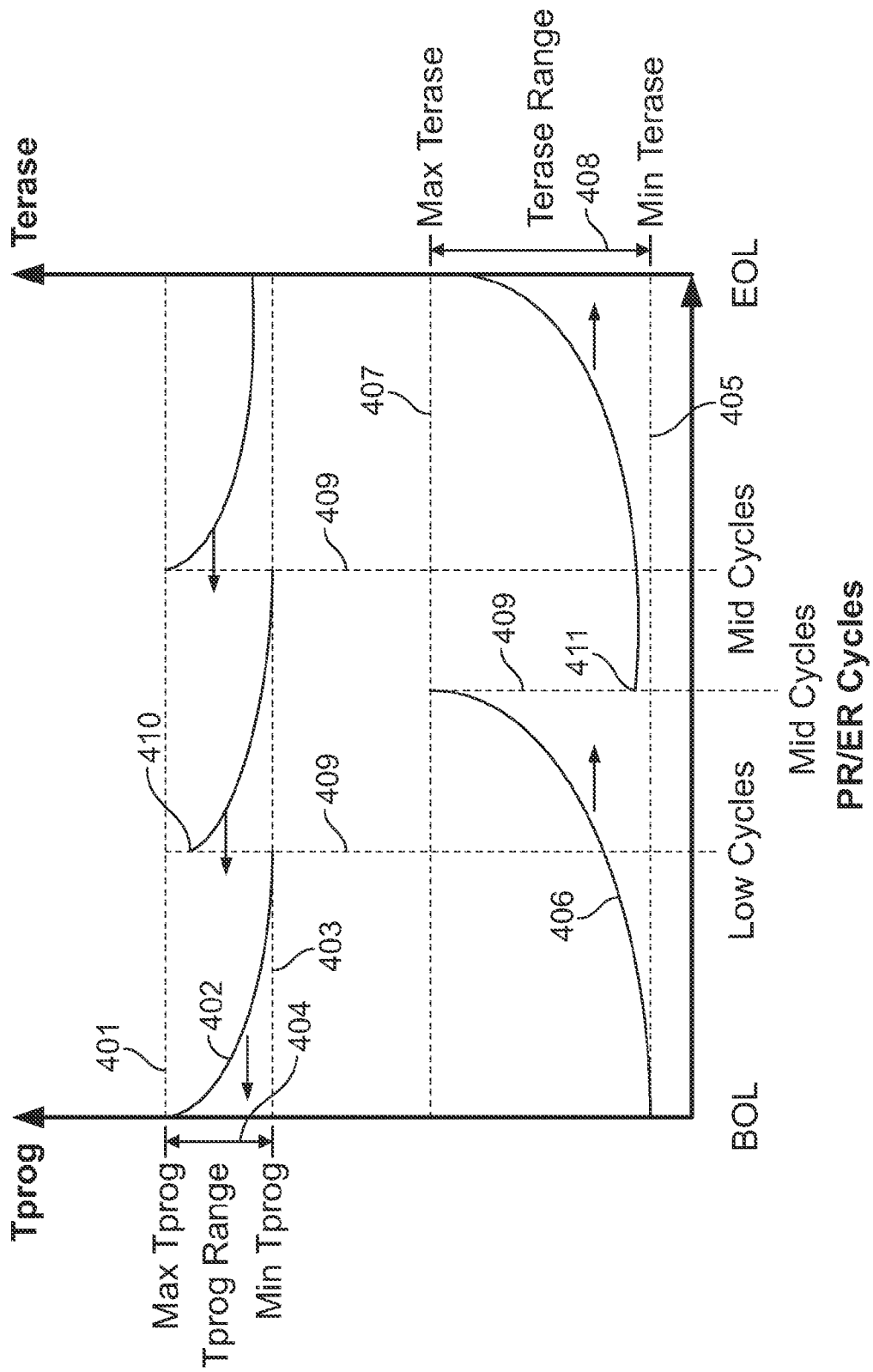
FIG. 4 is a graph diagram illustrating program and erase time evolutions according to one aspect of the subject technology.

FIG. 4 is a graph diagram illustrating program and erase time evolutions according to one aspect of the subject technology. At beginning of life (BOL), a write operation will take a maximum programming duration 401. As flash memory 103 is cycled and trapped charge builds up in the memory cells, the programming time 402 will progressively decrease towards a minimum programming duration 403, producing a programming duration range 404 over a range of P/E cycles. Conversely, at BOL an erase operation will take a minimum erase duration 405. As a distribution of cells' $V_T$ rise due to excessive cycling, erase time 406 will progressively increase toward maximum erase duration 407, producing an erase duration range 408 over a range of cycles. Controller 101 is configured to determine parameters for ISPP and ISPE as a function of various circuit characteristics and send commands to flash memory 103 to dynamically reset the programming and/or erase conditions and correct the distributions. As previously illustrated, parameters may include starting magnitude, step magnitude, pulse width, and the like. In some aspects, parameters are determined as a function of certain circuit characteristics, including, for instance, the current number of P/E cycles, a value based on the number or range of P/E cycles, programming and/or erase time, retention time, memory block address, memory page address, or a temperature (for example, the die temperature of flash memory 103).

In some aspects, controller 101 may be programmed to check, determine, and/or adjust the program and/or erase conditions on a trigger event 409. In some aspects, trigger event 409 may be a number or range of P/E cycles (for example, every 1,000 cycles after an initial trigger at 500 cycles) or a set duration (for example, programming time 402, erase time 406, or the age of the SSD). In one aspect, controller 101 may be configured to monitor a duration and to invoke a trigger event when the monitored condition (for example, programming time 402 or erase time 406) exceeds a predetermined limit (for example, minimum programming duration 403, maximum programming duration 401, minimum erase duration 405, maximum erase duration 407, or the like). In another aspect, controller 101 may be configured to monitor the number of programming or erase steps/loops and invoke a trigger event when the number of steps/loops reaches and/or exceeds a predetermined count. For example, once it is detected that five steps/loops instead of four are required to program or erase, the program or erase conditions may be checked and/or adjusted. In yet another aspect, controller 101 may obtain the total time required to program or erase and invoke a trigger event when the total time exceeds a predetermined duration.

On the trigger event, controller 101 may determine and adjust the ISPP and/or ISPE parameters to new values to adjust the programming and/or erase conditions. In some aspects, the same trigger event may trigger adjustment of both ISPP and ISPE parameters and/or conditions. In other aspects, the trigger events are separate for programming and erase conditions (see FIG. 4). The trigger event may also be based, in some aspects, on either a predetermined cycle number or on the duration of the write and/or erase operation, any of which may be monitored by controller 101 with a certain periodicity (for example, after a certain number of P/E cycles). There may also be multiple trigger events 409 stored for both write and erase operating conditions. In some aspects, controller 101 may adjust the parameters such that the programming conditions get progressively milder over the life span of flash memory 103. For example, where trigger event 409 is based on a number or range of P/E cycles (see FIG. 4), controller 101 may be configured to progressively set the ISPP starting pulse voltage level lower at each successive trigger event so that revised maximum duration 410 does not cause the BER to increase beyond an acceptable predetermined limit (for example, maintain standard deviation 501 below maximum deviation 503 and/or sufficiently below the adjacent higher read level).

In some aspects, controller 101 may access one or more trigger lookup tables stored on storage medium 102 to determine when a trigger should take place. The one or more lookup tables may provide trigger information based on a number of P/E cycles or range of cycles and/or a duration as previously described. In some aspects, adjustments to parameter values are planned as the drive ages via one or more parameter lookup tables, which may be indexed by cycle and/or timestamp. Once a trigger event is met (for example, "BOL", "low cycles", "mid cycles", "EOL"), controller 101 accesses the one or more parameter lookup tables to facilitate adjustment of the ISPP and/or ISPE parameters. Where the trigger event is based on a number or range of P/E cycles, the number or range used can either be an average across all memory blocks in flash memory 103 or based on individual memory block information. Depending on the observed block-to-block and chip-to-chip variation, a dynamic adjustment can be performed on all flash memories 103 in storage system 100 at once, on individual chips, on individual blocks, or on individual pages. One or more trigger events may optionally be embedded in the hardware of controller 101 or included in programming code which is executed on controller 101.

In some aspects, controller 101 may be configured to invoke trigger event 409 when programming duration 402 reaches minimum programming duration 403. On trigger event 409, the ISPP parameters are reduced so that the distributions are more narrowly programmed and retain sufficient spacing from adjacent read level voltages. Briefly referring to FIG. 3, controller 101 may be configured to program flash memory 103 so that, once some of the cells in a distribution (for example, L1 distribution 205) are beyond a program verify voltage (for example, program verify voltage 305), the ISPP parameters are adjusted so that further programming of the page and/or block using ISPP does not cause cells in the distribution having larger magnitudes (for example, having excess electrons due to degradation of the cells) to become too close to the adjacent higher read level voltage (for example, voltage 303), thereby narrowing the standard deviation of the distribution.

Resetting the ISPP parameters may have an impact on programming duration. In some aspects, controller 101 may reset the ISPP parameters as a function of programming duration 402 to maintain programming duration 402 within predefined limits. For example, if controller 101 determines that maximum programming duration 401 would render an unacceptable BER (for example, after extended retention), controller 101 may determine and adjust the ISPP parameters (for example, to higher levels) to modify programming duration 402 such that its maximum limit is maintained or lowered to a revised maximum duration 410. Likewise, if minimum programming duration 403 would render an unacceptable BER (for example, after excessive cycling), controller 101 may determine and adjust the ISPP parameters (for example, to lower levels) to modify programming duration 402 such that its minimum limit is maintained or raised to a revised minimum programming duration.

The maximum acceptable BER may be determined by a maximum number of bits correctable by ECC. In this regard, controller 101 uses ECC to accommodate a certain level of BER. For example, controller 101 may be configured to receive a page and/or block of data and process that data using ECC (for example, an ECC algorithm) to determine BER and then determine whether that BER is within a predetermined acceptable limit. If BER is too high then controller 101 may determine that a $V_T$ distribution has shifted to an unacceptable level (for example, too high). Controller 101 may be configured to adjust the program and/or erase conditions in accordance with the previously described procedure based on the increase and/or decrease in BER (for example, at a specific value or error slope/acceleration thereof).

Figure 5:
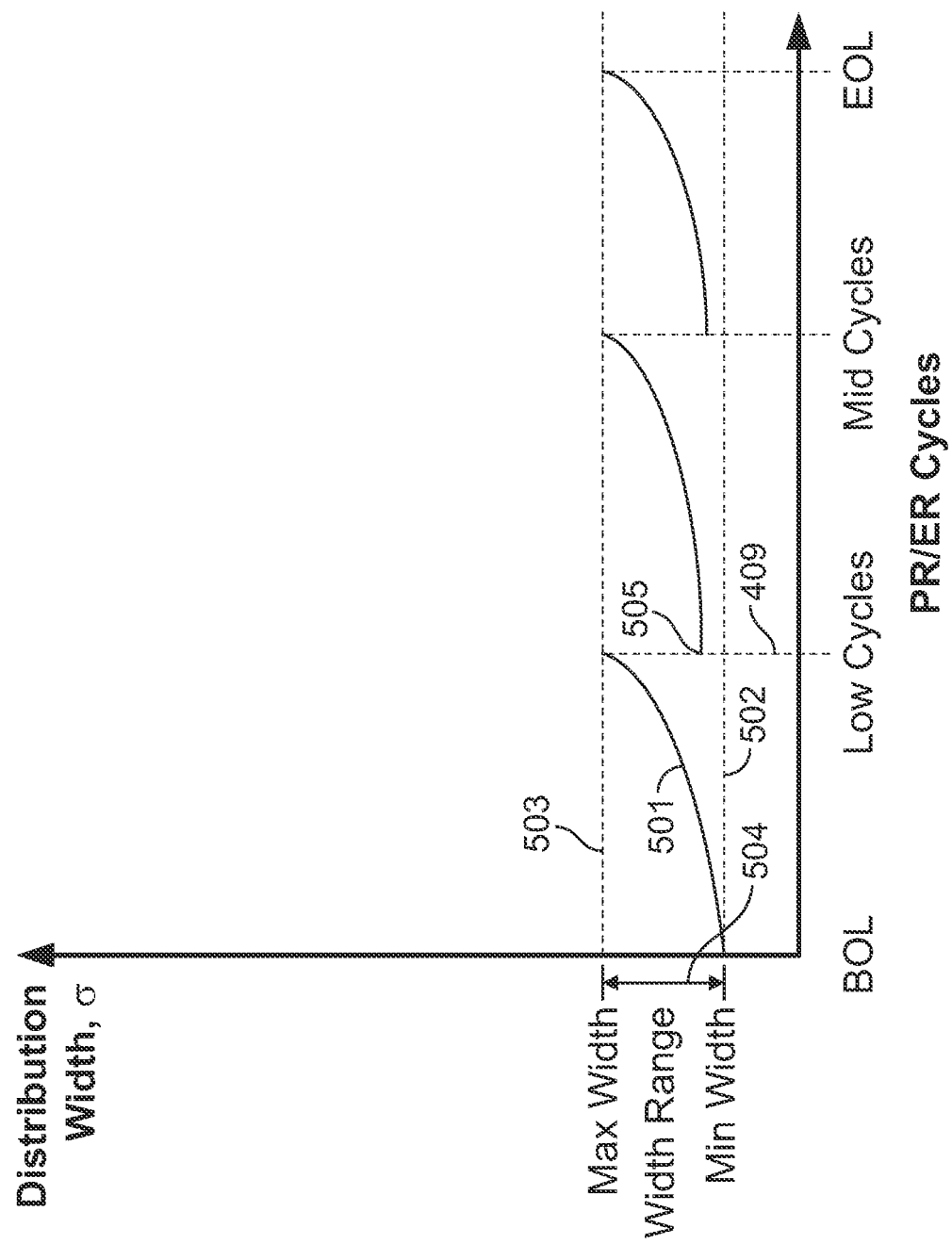
FIG. 5 is a graph diagram illustrating the $V_T$ distribution width evolutions according to one aspect of the subject technology.

FIG. 5 is a graph diagram illustrating programmed $V_T$ distribution width evolution according to one aspect of the subject technology. At BOL, the standard deviation 501 of a programmed $V_T$ distribution will generally be at its narrowest, at or near minimum deviation 502. As flash memory 103 is cycled and memory 103 degrades, standard deviation 501 will eventually widen to a maximum deviation 503, producing deviation range 504. In some aspects, maximum deviation 503 will be determined by trigger event 409 (for example, number or range of P/E cycles 705 and/or a desired programming duration). In other aspects, trigger event 409 may be triggered when BER reaches and/or surpasses a predetermined limit (for example, evidencing maximum deviation 503). In some aspects, as memory degrades, obtaining minimum deviation width 502 will no longer be possible. Adjustment of the ISPP parameters may maintain standard deviation 501 within deviation range 504, and/or to move standard deviation 501 as close as possible to minimum deviation 502, at a revised minimum deviation 505. For example, revised minimum deviation 505 may be the result of physical degradation of the memory device and/or revised programming duration 410 (see FIG. 4).

On trigger event 409, controller 101 determines ISPP parameters to correct standard deviation 501 (for example, narrow and/or shift the distribution). In some aspects, controller 101 may be configured to monitor BER (for example, periodically or on a read or write operation) and, if it determines that one or more of the programmed $V_T$ distributions are outside the deviation limit (for example, determines a distribution is at maximum deviation 503 by receiving a high BER), further determine and adjust the ISPP parameters. Controller 101 may determine and adjust the ISPP parameters such that the next programming operation performed will create a $V_T$ distribution of memory cells having a standard deviation at or near minimum deviation 502. The ISPP parameters may further be set as a function of ISPP programming time 402 and/or erase time 406. For example, in some aspects, if setting the ISPP parameters to achieve minimum deviation 502 would render an unacceptable programming or erase time, controller 101 may determine and adjust the parameters such that the programming or erase time is within an acceptable limit, raising the minimum limit of standard deviation 501 to revised minimum deviation 505. In one example, a periodic reduction of ISPP parameters (for example, step increment) may result in periodic reduction of standard deviation 501.

Figure 6:
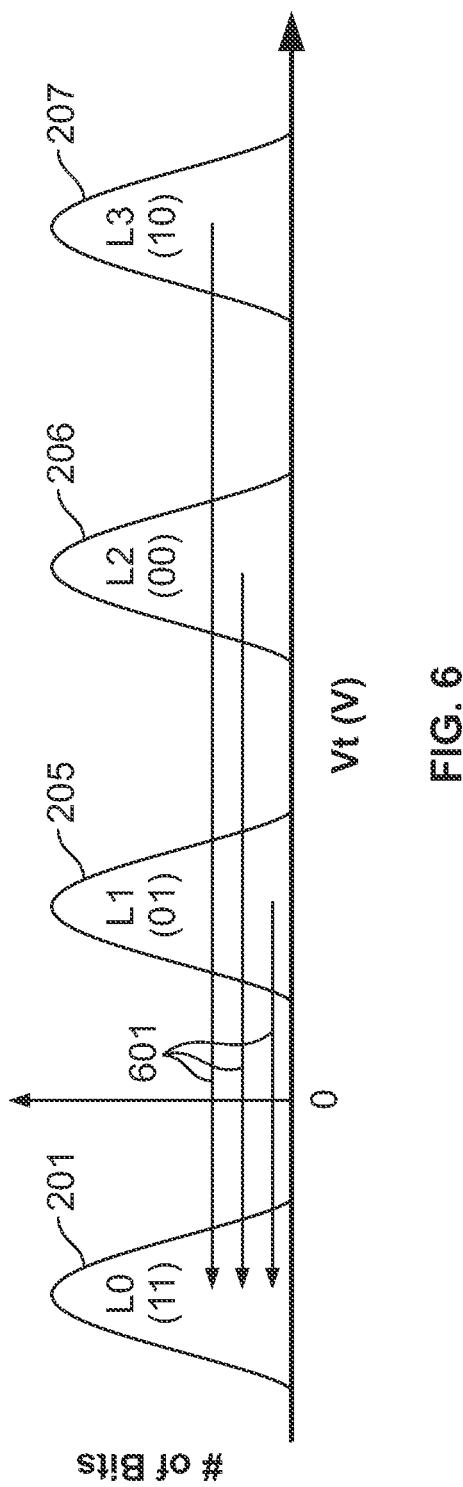
FIG. 6 is a graph diagram illustrating a single-phase erase procedure according to one aspect of the subject technology.

FIG. 6 is a graph diagram illustrating a single-phase erase procedure according to one aspect of the subject technology. In some aspects, flash memory 103 is instructed by controller 101 to perform an Incremental Step Pulse Erase (ISPE) whereby all of the programmed levels, for example, L1 distribution 205, L2 distribution 206, and L3 distribution 207, are returned 601 to the L0 distribution state 201. Similar to ISPP, controller 101 is configured to issue commands to flash memory 103 to apply a series of voltage pulses to the memory cells which are being erased. In the case of an erase operation, the amplitude polarity is reversed (from ISPP) to remove electrons from the floating gates of the memory cells. In some aspects, the ISPE includes a series of voltage pulses that are applied in a step pattern with the amplitude of each pulse incrementally increased with increasing pulse number, starting from a starting magnitude. Those skilled in the art will recognize that ISPE can be performed in a similar manner to ISPP, including, for example, adjustment of the pulse parameters, conditions, verification, and the like.

ISPE is applied to all of the cells of a memory block at once (for example, 64 or 128 or more pages). Controller 101 may be configured to determine and/or adjust one or more ISPE parameters, including, for example, starting magnitude, step magnitude, the number of steps, the width of the erase pulses, current, slope, and the like. In some aspects, the step between the first and the second pulses can, sometimes, be defined separately from subsequent steps. In some aspects, an erase operation may be followed by a very mild programming step (controlled by its own ISPP starting magnitude and step), to render the final erased distribution narrower (for example, to reset L0 distribution 201). Similar to ISPP, those skilled in the art will recognize how to select the appropriate parameters as input to an ISPE to achieve an erased distribution (for example, L0) from a selected higher distribution (for example, L1, L2, or L3).

Similar to setting programming time 402, the erase conditions may be adjusted based on circuit characteristics, including the current number of P/E cycles and/or duration. Controller 101 may be configured to determine erase time 406 or erase duration range 408 based on various factors, including a cycle number (predetermined in one or more lookup tables or calculated by controller 101), magnitude of memory erase time 406, and the like. To erase a memory block, controller 101 receives a signal from the host interface representative of an erase operation to erase a block of flash memory 103. In some aspects, as the flash memory block is cycled, erase conditions may be made progressively stronger by increasing the ISPE parameters, including starting magnitude voltage, steps, and pulse widths, while keeping the memory erase time 406 within erase duration range 408. In one aspect, erase duration range 408 of memory erase time 405 may be chosen to be relatively small to increase the overall performance of the system without sacrificing endurance of flash memory 103. A range of acceptable erase durations may be stored in one or more lookup tables on storage medium 102. In some aspects, controller 101 may also be configured to monitor the duration of the ISPE and, on sensing memory erase time 406 has reached a maximum erase duration 407, send commands to flash memory 103 to modify the ISPE parameters such that erase time 406 is reduced toward minimum erase duration 405 or a revised minimum erase duration 411.

Figure 7:
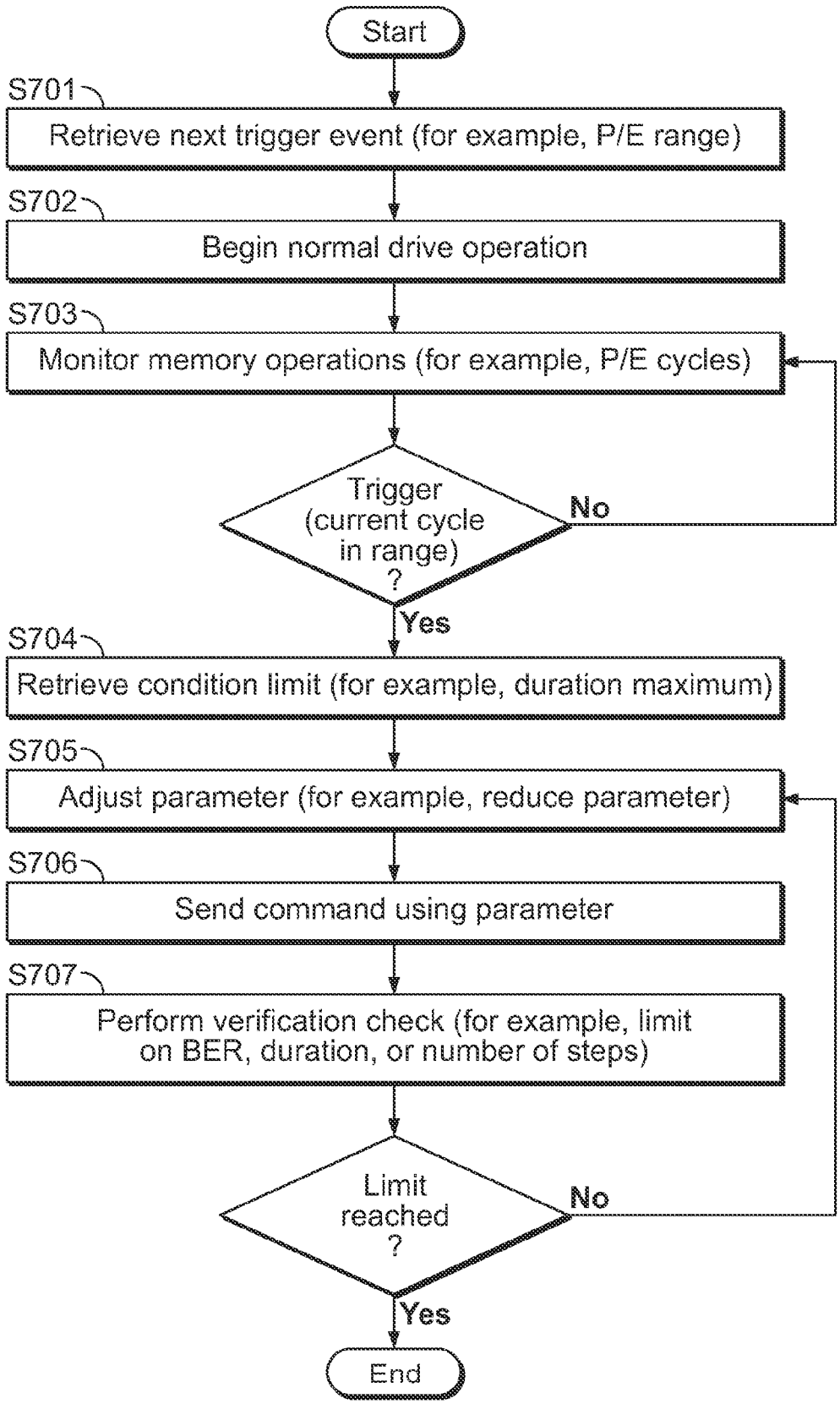
FIG. 7 is a flowchart illustrating a process for determining adjusted programming and/or erase parameters according to one aspect of the subject technology.

FIG. 7 is a flowchart illustrating a process for determining adjusted programming and/or erase parameters according to one aspect of the subject technology. In step S701, a trigger event (for example, trigger event 409, described previously) is retrieved from one or more lookup tables on storage medium 102. In step S702, storage system 100, including controller 101, begins normal drive operation. In step S703, controller 101 monitors memory operations (for example, the current P/E cycle count and/or programming or erase duration), and waits for the trigger event. On the trigger event, in step S704, controller 101 optionally retrieves one or more condition values to be used in the calculation of the parameter to be adjusted (for example, maximum programming duration 403, minimum programming duration 401, programming range 404, minimum erase duration 405, maximum erase duration 407, erase duration range 408, and/or the like). In some aspects, the one or more condition values may optionally be embedded in the hardware of controller 101 or included in programming code which is executed on controller 101. In one aspect, step S704 may be omitted and/or the condition value previously retrieved in an antecedent step.

In step S705, controller 101 begins to adjust the current ISPP and/or ISPE parameters for the next programming and/or erase cycle. Controller 101 may determine one or more new parameters (for example, starting magnitude voltages, steps, and pulse widths) as a function of program and/or erase cycles. In another aspect, controller 101 determines new parameter(s) as a function of stored values, for example, values located in a lookup table. On trigger event 409, controller 101 indexes the lookup table by one or more present characteristics (for example, P/E cycle, temperature, a duration, and the like) to retrieve the parameter(s). In one aspect, controller 101 may be optionally configured to adjust the parameter(s) while checking to make sure the operating conditions (for example, programming duration 402) are within the designated limits/range. For example, controller 101 may perform a calculation of programming duration 402 in conjunction with a calculation of the parameters such that programming duration 402 remains within a programming range 404. This may also include determining (for example, calculating) the parameters such that programming duration 402 is reset to maximum programming duration 401 or revised maximum duration 410. Controller 101 may store the current parameter(s) (for example, in storage medium 102) and adjusts the parameter(s) based on desired operating conditions.

In one aspect, when adjusting a programming condition, controller 101 may be configured to reduce one or more parameters (for example, step increment and/or width) to reduce standard deviation 501 in the $V_T$ distribution of the cells being programmed (for example, after extensive cycling) and/or to increase programming time 402. In some aspects, an increase in programming time 402 is a result of reducing the parameter(s). In other aspects, the reduction of parameters may be selected and/or determined based on programming time 402, which results in reducing standard deviation 501. With reference to FIG. 3, middle row, a reduction in parameters may narrow standard deviation 501 and correct the distribution by shifting the higher end of the distribution to the left. For example, controller 101 may first decrease the starting magnitude of the first ISPP pulse and then maintain and/or reduce the step increment and/or pulse width to maintain an upper range of the distribution at a sufficient distance from the next higher read level (for example, after a predetermined number of cycles). Conversely, in other aspects, controller 101 may be configured to increase one or more parameters (for example, starting magnitude) to reduce programming time 402 (for example, after extended retention time). In some aspects, a reduction in programming time 402 may be a result of increasing the parameter(s) to reduce standard deviation 501. In other aspects, the increase may be selected and/or determined based on programming time 402 which results in reducing standard deviation 501.

Once the parameter(s) is determined, in step S706, controller 101 programs flash memory 103 to execute ISPP and/or ISPE on the block. In some aspects, controller 101 provides the adjusted parameters to flash memory 103 via registers 106 (for example, the test register), and/or by sending one or more commands to internal flash controller 107. In step S707, during a programming operation, controller 101 performs a verification check to verify that the newly adjusted parameter(s) does not cause the impacted memory condition to reach and/or exceed a predetermined limit (for example, a predetermined limit on BER, a limit on number of steps, and/or cause programming time 402 to fall out of range 404 or exceed maximum programming duration 401). If the limit and/or range is exceeded then controller 101 may readjust the parameter(s) in a closed loop by returning to step S705. The limit or programming time 402 may be determined by a verification operation undertaken by flash memory 103. For example, flash memory 103 may cease programming the distribution when all the cells are at (or above) the program verify level 305 (see FIG. 3). Thus, in step S705, once the distribution has been verified, further adjustment of the parameter(s) will cease, thereby determining programming duration 402. In some aspects, the verification is undertaken by controller 101 during the calculation of the parameter(s) before any command is sent to flash memory 103.

The previously described steps S705 through S707 are equally applicable to adjusting erase conditions. In one aspect, when adjusting an erase condition, controller 101 is configured to increase one or more parameters (for example, starting magnitude) to reduce erase time 406. In step S707, during an erase operation, controller 101 may check that the newly adjusted parameter(s) does not cause erase time 406 to fall out of range 408 (for example, exceed maximum erase duration 405). In other aspects, erase time 406 may be determined by a verification operation, that is, flash memory 103 will undertake program verification operations and cease erase when all the cells are at (or below) an erase verify level. Thus, in step S707, once L0 distribution 201 has been verified, further adjustment of the parameter will cease, thereby modifying erase duration 406 such that its minimum limit is maintained or raised to a revised minimum duration 411 (see FIG. 4).

Figure 8A:
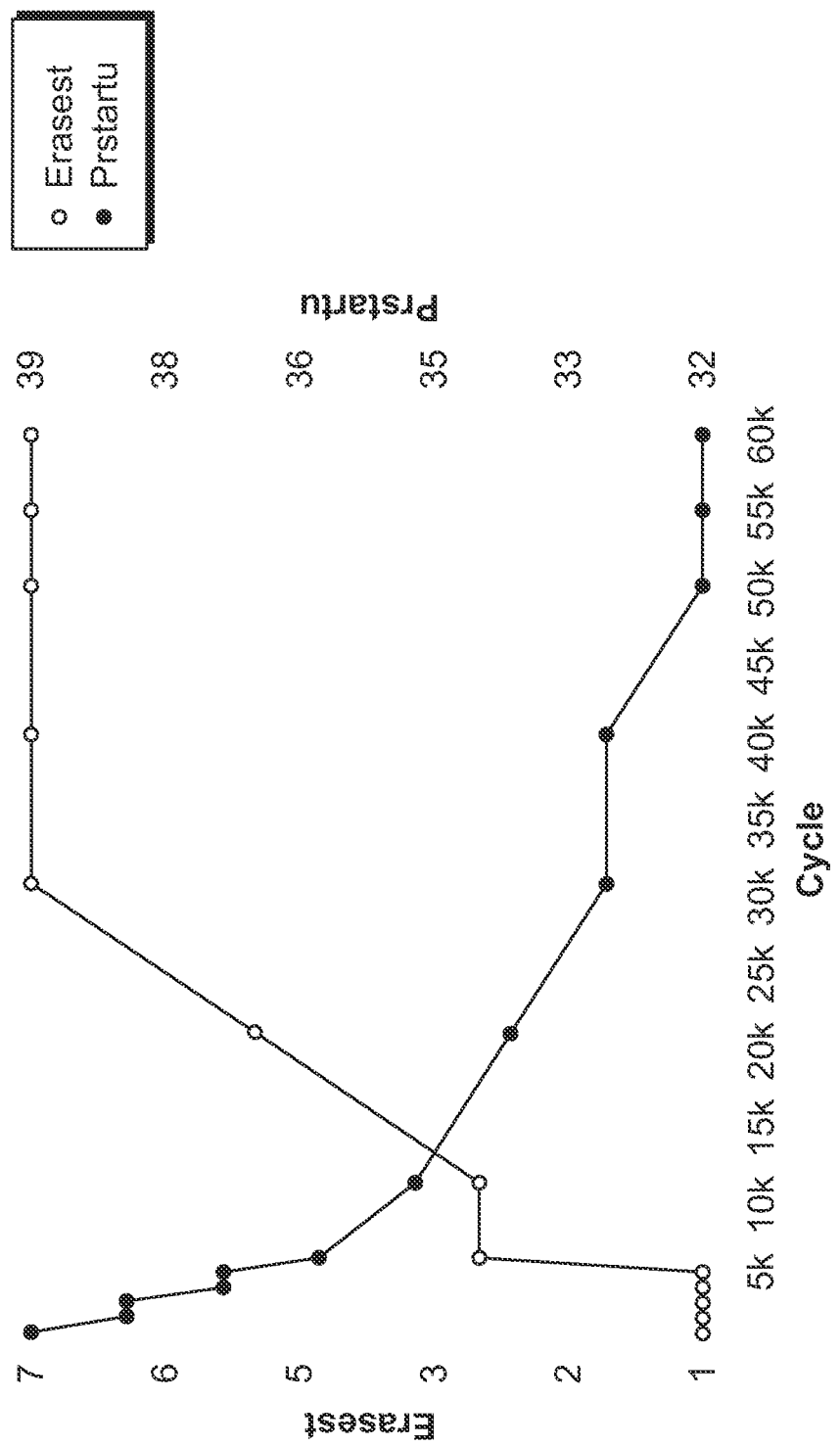
FIGS. 8A to 8C are graph diagrams illustrating measured programming and erase time evolution over P/E cycling for a NAND flash memory device according to one aspect of the subject technology.
Figure 8B:
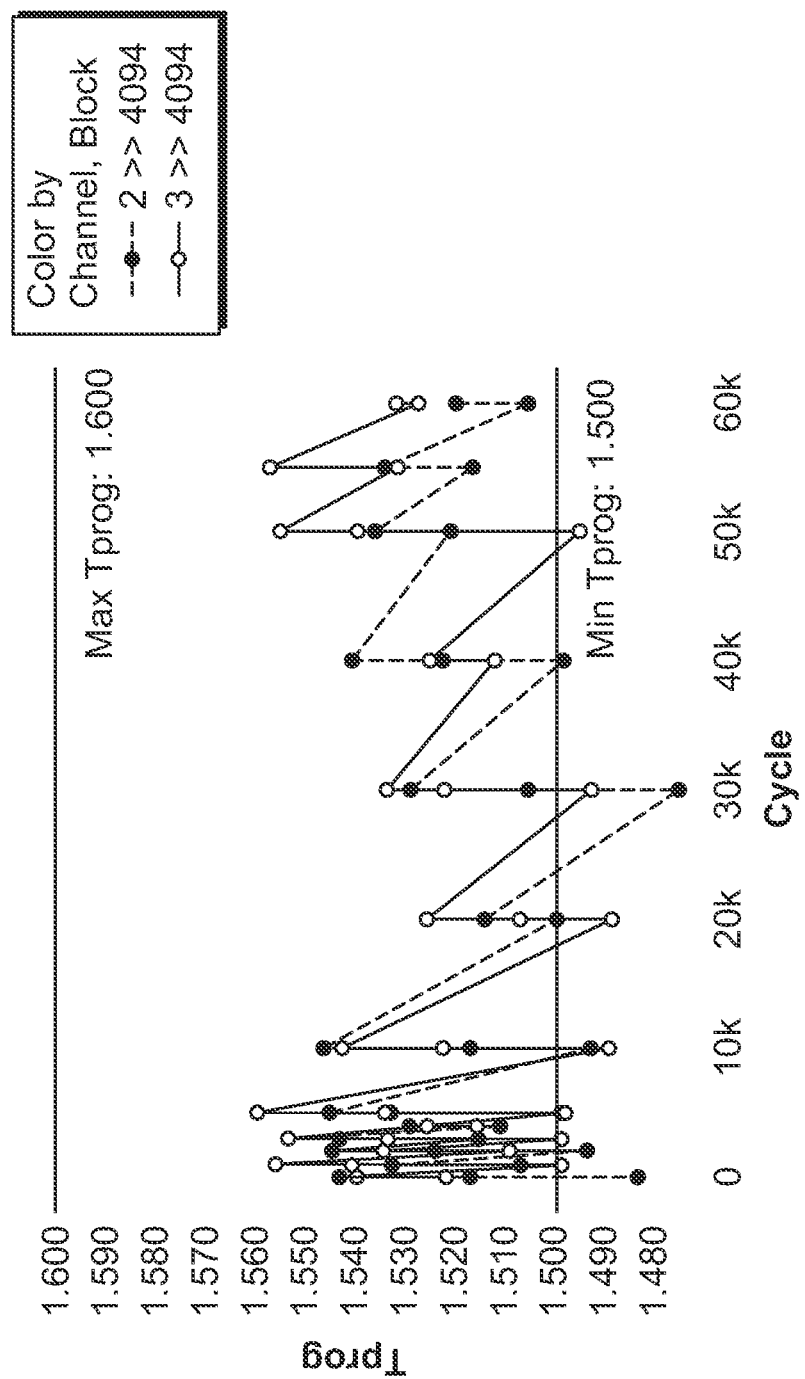
Figure 8C:
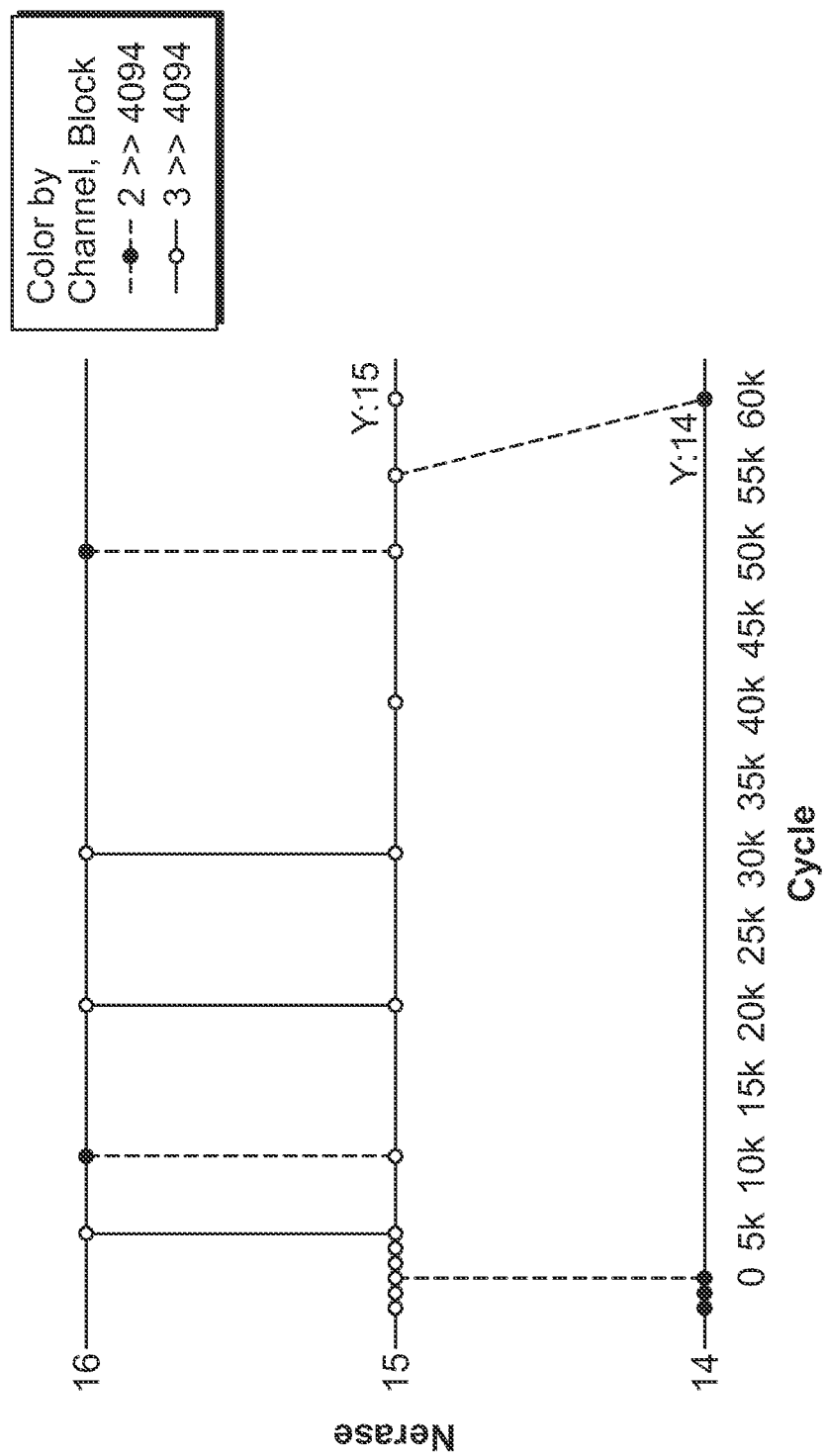

FIGS. 8A to 8C are graph diagrams illustrating measured programming and erase time evolution over P/E cycling for a NAND flash memory device according to one aspect of the subject technology. In the depicted graph diagrams, the subject technology was applied to a NAND flash memory device to maintain an acceptable BER while cycling the device above the manufacturer specified limit of 30 k P/E cycles. FIG. 8A is a graph diagram illustrating an evolution of starting program pulse voltage levels and starting erase pulse voltage levels that were applied. An ISPP starting pulse voltage register, PRSTARTU, was used to specify the starting program pulse voltage level as a function of P/E cycles. An ISPE starting erase pulse voltage level register, ERASEST, was used to specify the starting erase pulse voltage level as a function of P/E cycles. As depicted in FIG. 8A, the subject technology adjusts the ISPP starting program pulse voltage level and the ISPE starting erase pulse voltage level as a function of P/E cycles in order to keep the values of $T_{PROG}$ and $T_{ERASE}$ within their respective allowed limits. The controller periodically performs a check to see whether $T_{PROG}$ and $T_{ERASE}$ need to be adjusted at specific P/E cycles counts: 1 k, 2 k, 3 k, 4 k, 5 k, 10 k, 20 k, and the like.

FIG. 8B illustrates measured programming time as a function of P/E cycles. Programming time $T_{PROG}$ is graphed corresponding to the adjustment of ISPP starting program pulse voltage level. A minimum and maximum allowed $T_{PROG}$ were chosen as 1.5 ms and 1.6 ms, respectively. $T_{PROG}$ value was measured at specific P/E cycles, and, as collectively depicted by FIGS. 8A and 8B, once $T_{PROG}$ falls below a minimum of 1.5 ms, starting program pulse voltage is reduced until $T_{PROG}$ is within allowed limits. Similarly, FIG. 8C illustrates the measured evolution of the number of erase pulses as a function of P/E cycles. The number of erase pulses, $N_{ERASE}$, is graphed corresponding to the adjustment of starting erase pulse level (depicted in FIG. 8A). Erase time (for example, between 750 µs and 1 ms per erase pulse), $T_{ERASE}$, is proportional to the number of erase pulses, $N_{ERASE}$.

In the depicted measurement, the minimum and maximum allowed number of erase pulses were chosen as 14 and 15, respectively. The number of erase pulses, $N_{ERASE}$, was also measured at the depicted P/E cycles, and once $N_{ERASE}$ was above a maximum of 15, starting erase pulse voltage was increased until $N_{ERASE}$ was within allowed limits. According to the measurement results illustrated in FIGS. 8A to 8C, the subject technology may achieve 60 k P/E cycles while keeping the $T_{PROG}$ and $T_{ERASE}$ within their limits and maintaining a BER level lower than that originally specified by the device manufacturer at 30 k P/E cycles.

It has been found that a long data retention time can be mimicked by subjecting flash memory 103 to an accelerated test, which amounts to a bake in an oven at elevated temperatures causing a post-bake $V_T$ distribution shift, which increases with P/E cycles. It has also been found that, using the subject technology, ISPP and/or ISPE parameters may be chosen such that the widths of the $V_T$ distributions of the cycled memory cells are kept relatively wide at a small number of P/E cycles. For the same desired retention time, the cycled $V_T$ distributions can be set wider if the memory block underwent fewer P/E cycles. Conversely, the width of the $V_T$ distributions can be made progressively narrower at higher P/E cycles, if the same retention time needs to be maintained.

Figure 9:
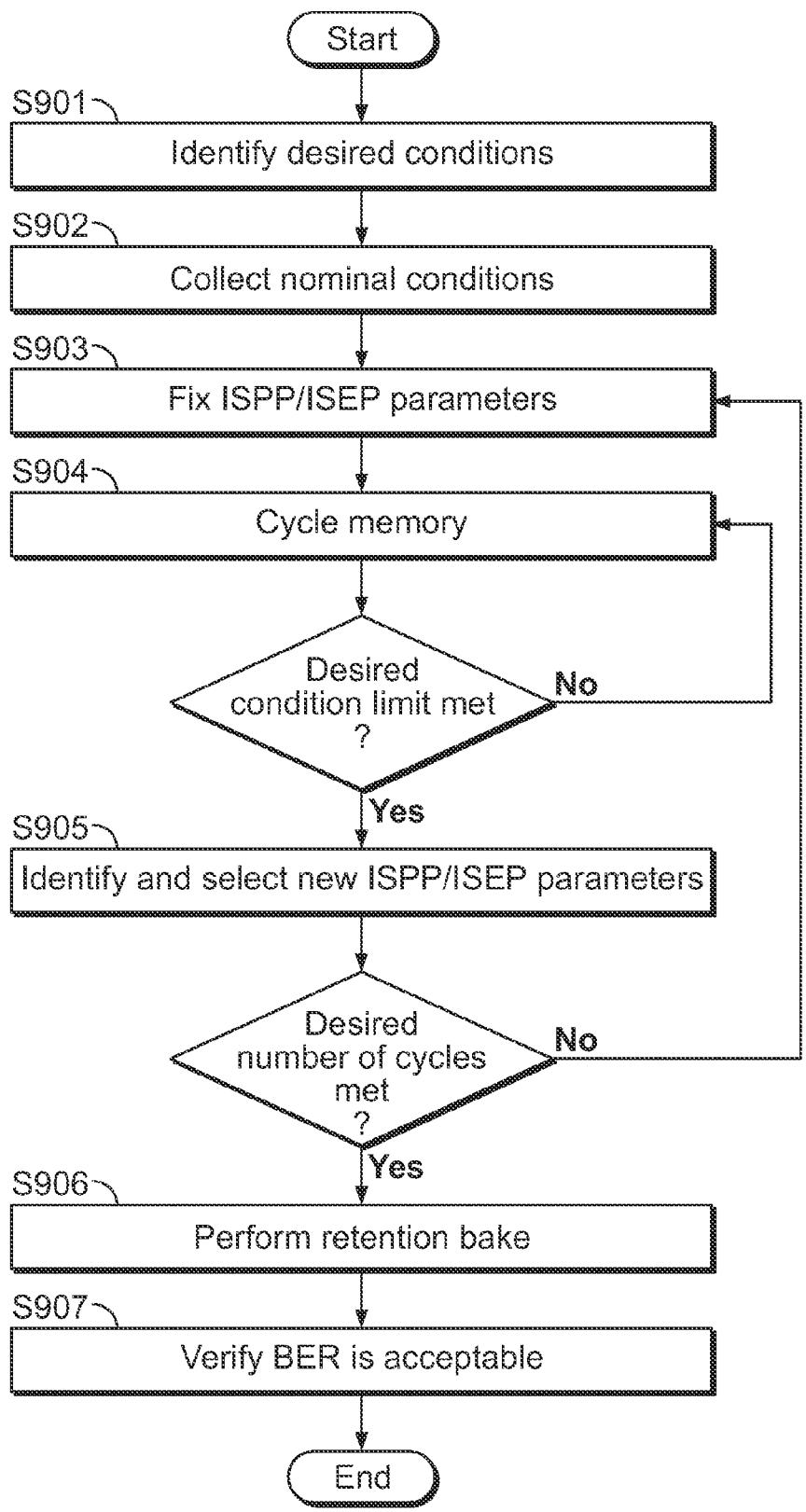
FIG. 9 is a flowchart illustrating a process for obtaining optimal BOL condition values for P/E parameters to be implemented on a NAND memory block according to one aspect of the subject technology.

FIG. 9 is a flowchart illustrating a process for obtaining optimal ISPP and/or ISPE parameters to be implemented on a NAND memory block according to one aspect of the subject technology. In step S901, the desired ranges and/or limits of programming time 402 ($T_{PROG}$), erase time 406 ($T_{ERASE}$), and standard deviation 501 are identified and stored in storage medium 102. In step S902, controller 101 collects nominal $T_{PROG}$, $T_{ERASE}$, and $V_T$ distribution data for a block in flash memory 103 as a function of ISPP and/or ISPE parameters. A parameter set for ISPP and/or ISPE is determined based on the nominal data collected and, in step S903, the parameter set is fixed and controller 101 provides flash memory 103 with the parameter set for ISPP and/or ISPE operations. In some aspects, the parameter set may also be stored on storage medium 102 and/or associated with a specific block. In further aspects, the parameter set may be stored in one or more parameter lookup tables and indexed by P/E cycle or other operating and/or circuit characteristic herein described. Controller 101 may access the lookup table during runtime to retrieve the parameter(s) and to adjust the operating conditions.

Figure 10:
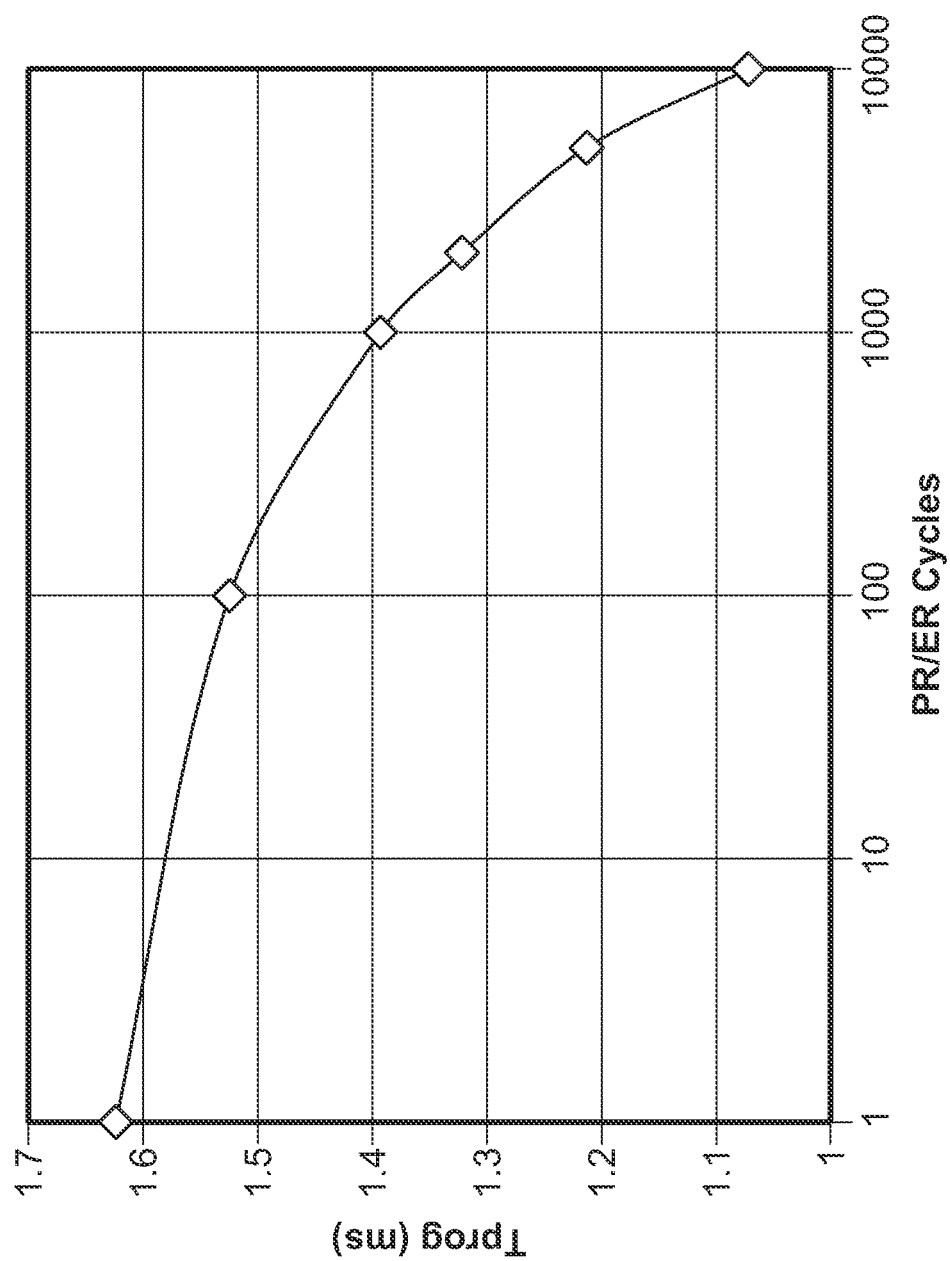
FIG. 10 is a graph diagram illustrating an exemplary $T_{PROG}$ evolution over P/E cycling according to one aspect of the subject technology.

In step S904, a memory block of flash memory 103 is then selected and cycled N times until $T_{PROG}$ reaches minimum programming duration 403, $T_{ERASE}$ reaches maximum erase duration 403, and/or standard deviation 501 reaches maximum deviation width 503 (see FIGS. 4 and 5). FIG. 10 is a graph diagram illustrating an exemplary $T_{PROG}$ evolution over P/E cycling according to one aspect of the subject technology. In step S905, after the block has been cycled for N times, a new satisfactory set of ISPP and/or ISPE parameters is identified and selected. In this regard, the new parameters may be manually selected to achieve an optimal $T_{PROG}$, $T_{ERASE}$, and/or standard deviation. The new parameters are selected to allow further cycling of flash memory 103 in view of the $V_T$ degradation occurring as a result of step S904. The parameters may also be, at least in part, determined as a function of circuit characteristics (for example, P/E count, die temperature, current increase, memory block address, memory page address and the like). Accordingly, controller 101 provides flash memory 103 with the new parameter set for further ISPP and/or ISPE operations. Steps S904 and S905 may then be repeated until a desired number of P/E cycles is reached. Each resulting parameter set from repeated step S905 may be included in the one or more parameter lookup tables described in step S903. After the desired cycles has been reached, in step S906, the memory block is put through a retention bake. In step S907, one or more post-bake reads may then be undertaken to make sure that the maximum number of cycles reached does not result in excessive BER.

Choosing memory program and erase conditions statically at the beginning of life (BOL) in 2-bit/cell MLC NAND flash devices, results in wide SSD performance variation and limits the number of P/E cycles a memory device can undergo, given the maximum acceptable BER level and the expected retention time. Contrary to industry practice, in the subject technology, program and erase conditions are not fixed apriori. In some aspects, they are dynamically adjusted to conform to deteriorating, and thus moving, voltage threshold distributions as the memory device degrades during cycling and retention. They may further be adjusted to reduce BER. In some aspects, the adjustment occurs during run-time, for example, when the drive is in operation. By dynamically adjusting program and erase conditions, for the same level of maximum acceptable BER and the same expected retention time, the subject technology allows a drive to achieve a higher number of cycles than a drive without the subject technology. Similarly, for the same number of cycles and the same expected retention time the subject technology allows the SSD to achieve a lower BER, markedly improving SSD performance throughout the lifetime of the drive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean that the processor is programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for adjusting an operating condition in a memory block of a non-volatile memory circuit, comprising: storing a parameter, the operating condition being a function of the parameter;
monitoring a memory operation for a trigger event, the trigger event including a programming time satisfying a threshold programming duration; and
on the trigger event, adjusting the parameter in accordance with a circuit characteristic associated with the memory block, and
providing to the memory circuit a command representative of an instruction to apply a series of voltage pulses to a group of cells in the memory block in accordance with the adjusted parameter to adjust the operating condition.

2. The method of claim 1, wherein each pulse in the series of pulses is an incremental step pulse such that an amplitude of each pulse is incrementally increased with each increasing pulse number, starting from a start magnitude.

3. The method of claim 1, wherein adjusting the parameter in accordance with the circuit characteristic includes indexing a lookup table by a number of P/E cycles to determine the parameter.

4. The method of claim 3, wherein the number of P/E cycles is a range of P/E cycles, a current P/E cycle being in the range of P/E cycles.

5. The method of claim 1, wherein the operating condition includes a voltage distribution and adjusting the operating condition includes reducing a width of an upper portion of the voltage distribution and increasing the programming time, and adjusting the parameter in accordance with a circuit characteristic includes reducing the parameter.

6. The method of claim 5, wherein the trigger event includes the programming time reaching a minimum programming duration.

7. The method of claim 1, wherein the operating condition includes a voltage distribution, and adjusting the operating condition includes reducing a width of a lower portion of the voltage distribution and reducing a programming time, and adjusting the parameter in accordance with a circuit characteristic includes increasing the parameter.

8. The method of claim 1, wherein the parameter is a start magnitude.

9. The method of claim 1, wherein the parameter is a step magnitude.

10. The method of claim 1, wherein the parameter is a pulse width.

11. A control circuit for adjusting an operating condition in a memory block of a non-volatile memory circuit, comprising:
a memory interface configured to be operably coupled to the memory circuit; and
a controller, wherein the controller is configured to:
store a parameter, the operating condition being a function of the parameter,
monitor a memory operation for a trigger event, the trigger event including a programming time satisfying a threshold programming duration, and,
on the trigger event, adjust the parameter in accordance with a circuit characteristic associated with the memory block, and
provide to the memory interface a command representative of an instruction to apply a series of voltage pulses to a group of cells in the memory block in accordance with the adjusted parameter to adjust the operating condition.

12. The control circuit of claim 11, wherein the operating condition includes a voltage distribution, and adjusting the operating condition includes reducing a width of an upper portion of the voltage distribution and increasing the programming time, wherein the controller being configured to adjust the parameter in accordance with the circuit characteristic includes the controller being configured to reduce the parameter.

13. The control circuit of claim 11, wherein the operating condition includes a voltage distribution, and adjusting the operating condition includes reducing a width of a lower portion of the voltage distribution and reducing the programming time, wherein the controller being configured to adjust the parameter in accordance with a circuit characteristic includes the controller being configured to increase the parameter.

14. The control circuit of claim 11, wherein the trigger event includes a range of P/E cycles, and wherein the controller being configured to monitor the memory operation for the trigger event includes the controller being configured to determine that a current number of PIE cycles is within the range of P/E cycles.

15. A system for adjusting an operating condition in a memory block of a non-volatile memory circuit, comprising:
    a host interface configured to be operably coupled to a host device, to receive data from the host device, and to send data to the host device;
    a memory interface operably coupled to the memory circuit;
    a storage medium interface operably coupled to a volatile memory; and
    a controller operably coupled to the host interface, wherein the controller is operable to:
        store a parameter in the volatile memory, a duration of the operating condition being a function of the parameter,
        monitor a memory operation for a trigger event, the trigger event including the duration of the operating condition satisfying a threshold programming duration. and,
        on the trigger event, adjust the parameter in accordance with a circuit characteristic associated with the memory block, and
        provide to the memory circuit a command representative of an instruction to apply a series of voltage pulses to a group of cells in the memory block in accordance with the adjusted parameter to adjust the operating condition.

16. The system of claim 15, wherein the operating condition is a voltage distribution in the memory block, and wherein the memory circuit is configured to, in response to the command, apply the series of voltage pulses to the group of cells in the memory block in accordance with the parameter to adjust a width of the voltage distribution, each pulse in the series of pulses being an incremental step pulse such that an amplitude of each pulse is incrementally increased with each increasing pulse number, starting from a start magnitude.

17. The system of claim 15, wherein the trigger event includes a number of P/E cycles and the circuit characteristic includes an adjustment value associated with the number of P/E cycles, wherein the controller being configured to adjust the parameter in accordance with the circuit characteristic includes the controller being configured to index a lookup table stored on the volatile memory by the number of P/E cycles to determine the adjustment value.

18. A method for adjusting an operating condition in a memory block of a non-volatile memory circuit, comprising:
    storing a parameter, an erase time being a function of the parameter;
    monitoring a memory operation for a trigger event, the trigger event including the erase time satisfying a threshold programming duration; and
    on the trigger event, adjusting the parameter in accordance with a circuit characteristic associated with the memory block, and
    providing to the memory circuit a command representative of an instruction to apply a series of voltage pulses to a group of cells in the memory block in accordance with the adjusted parameter to adjust the operating condition.

19. The method of claim 18, wherein adjusting the operating condition includes reducing the erase time, and adjusting the parameter in accordance with a circuit characteristic includes increasing the parameter.

20. The method of claim 18, wherein the trigger event includes the erase time reaching a minimum erase duration.

21. A control circuit for adjusting an operating condition in a memory block of a non-volatile memory circuit, comprising:
    a memory interface configured to be operably coupled to the memory circuit; and
    a controller, wherein the controller is configured to:
        store a parameter an erase time being a function of the parameter,
        monitor a memory operation for a trigger event, the trigger event including the erase time satisfying a threshold programming duration, and,
        on the trigger event, adjust the parameter in accordance with a circuit characteristic associated with the memory block, and
        provide to the memory interface a command representative of an instruction to apply a series of voltage pulses to a group of cells in the memory block in accordance with the adjusted parameter to adjust the operating condition.

22. The control circuit of claim 21, wherein the operating condition includes the erase time, and adjusting the operating condition includes reducing the erase time, wherein the controller being configured to adjust the parameter in accordance with a circuit characteristic includes the controller being configured to increase the parameter.

23. The control circuit of claim 21, wherein the trigger event includes a range of P/E cycles, and wherein the controller being configured to monitor the memory operation for the trigger event includes the controller being configured to determine that a current number of P/E cycles is within the range of P/E cycles.

24. The system of claim 15, wherein the operating condition is a programming time, and the duration of the operating condition is a duration of the programming time.

25. The system of claim 15, wherein the operating condition is an erase time, and the duration of the operating condition is a duration of the erase time.

* * * * *